United States Patent
Beutel

(10) Patent No.: US 9,673,619 B2
(45) Date of Patent: Jun. 6, 2017

(54) EXCESS VOLTAGE PROTECTION APPARATUS AND DIAGNOSTIC METHOD FOR MULTI-STAGE EXCESS VOLTAGE PROTECTION APPARATUSES

(71) Applicant: PEPPERL + FUCHS GmbH, Mannheim (DE)

(72) Inventor: Micha Beutel, Alzey (DE)

(73) Assignee: PEPPERL + FUCHS GmbH, Mannheim (DE)

( * ) Notice: Subject to any disclaimer, the term of this patent is extended or adjusted under 35 U.S.C. 154(b) by 108 days.

(21) Appl. No.: 14/258,278

(22) Filed: Apr. 22, 2014

(65) Prior Publication Data

US 2014/0321018 A1    Oct. 30, 2014

(30) Foreign Application Priority Data

Apr. 26, 2013    (EP) .................................... 13165586

(51) Int. Cl.
*H02H 9/04*    (2006.01)
*H02H 9/06*    (2006.01)
*G01R 31/28*    (2006.01)

(52) U.S. Cl.
CPC ......... *H02H 9/042* (2013.01); *G01R 31/2827* (2013.01); *G01R 31/2825* (2013.01); *H02H 9/041* (2013.01); *H02H 9/06* (2013.01)

(58) Field of Classification Search
CPC ....... H02H 9/042; H02H 9/06; G01R 31/2827
USPC ....................................................... 361/91.1
See application file for complete search history.

(56) References Cited

U.S. PATENT DOCUMENTS

| | | | | |
|---|---|---|---|---|
| 4,438,395 A | * | 3/1984 | McClenahan | H01C 11/00 324/127 |
| 5,311,393 A | * | 5/1994 | Bird | H02H 9/06 337/144 |
| 5,869,878 A | * | 2/1999 | Hasegawa | G01K 7/01 257/341 |

FOREIGN PATENT DOCUMENTS

| | | |
|---|---|---|
| CN | 101777761 A | 7/2010 |
| DE | 102009004673 A1 | 7/2010 |
| EP | 2675032 A1 | 12/2013 |
| WO | 2008124587 A1 | 10/2008 |
| WO | 2010079132 A2 | 7/2010 |

(Continued)

OTHER PUBLICATIONS

International Search Report for International Application No. PCT/EP2014/067692, mailed Mar. 27, 2015, 4 pages.

(Continued)

*Primary Examiner* — Stephen W Jackson
*Assistant Examiner* — Christopher Clark
(74) *Attorney, Agent, or Firm* — Hoffman Warnick LLC

(57) ABSTRACT

The invention relates to a diagnostic method for multiple-stage excess voltage protection apparatuses that include at least one gas discharge distance between an input and a reference potential as a first stage, at least one diode path between an output and the reference potential as a second stage, and at least one decoupling inductance interposed between the input and the output. The diagnostic method is characterized in that a secondary voltage applied to a secondary inductance, which is actively connected, inductively, to the decoupling inductance, is measured and evaluated with a view to excess voltage events in the excess voltage protection apparatus. The invention also relates to a two-stage excess voltage protection apparatus.

14 Claims, 3 Drawing Sheets

(56) References Cited

FOREIGN PATENT DOCUMENTS

WO      2011058318 A1    5/2011

OTHER PUBLICATIONS

Application No. EP 13165586, Search Report, Sep. 16, 2013, 2 pages.
International Preliminary Report on Patentability and Written Opinion of the International Searching Authority for International Application No. PCT/EP2014/067692, 7 pages.

* cited by examiner

EXCESS VOLTAGE PROTECTION APPARATUS AND DIAGNOSTIC METHOD FOR MULTI-STAGE EXCESS VOLTAGE PROTECTION APPARATUSES

TECHNICAL FIELD

In a first aspect, the present invention relates to a diagnostic method for multi-stage excess voltage protection apparatuses, and in a second aspect, it relates to an excess voltage protection apparatus, by means of which the diagnostic method can be carried out.

RELATED ART

An excess voltage protection apparatus is disclosed, for example, in DE 10 2009 004 673 A1, and comprises the following components: an input and an output, at least one gas discharge distance between the input and a reference potential as the first stage, at least one diode path between the output and the reference potential as the second stage and at least one decoupling inductance interposed between the input and output. Such excess voltage protection apparatuses serve the purpose of barring excess voltage events that arise between the input and the reference potential from reaching electrical equipment interposed between the output and the reference potential. The gas discharge distance is also referred to as the first stage and the diode path as the second stage. For this reason, excess voltage protection apparatuses of this kind are referred to as two-stage excess voltage protection apparatuses.

A general problem to be solved in the case of such excess voltage protection apparatuses resides in the fact that after one or more events of excess voltage it is necessary to decide whether the excess voltage protection apparatus is still in working order or is already defective, in which case the excess voltage protection apparatus must either be completely replaced or only individual parts of the excess voltage protection apparatus. For this purpose, accurate information is required concerning the condition of components used in the excess voltage protection apparatus.

In this context, some solutions have already been proposed in the prior art, each of which is in need of improvement. First of all, a temperature in the casing and/or a temperature on the diode or diodes forming the diode path can be monitored by the use of one or more temperature control fuses. The response of the diode path can then be verified in that a voltage drop across the diodes can be detected using one or more opto-couplers. Furthermore, the response of gas arrester or arresters, seen in the form of flashes, can be detected by the use of photodiodes. Finally, a peak value of the total amount of current withdrawn can be measured.

These solutions in themselves make it possible to draw conclusions on the condition of the components used. However, such conclusions are not satisfactory as regards the unambiguity thereof. In addition, some of the monitoring methods mentioned do not provide useful information in all cases of an excess voltage event. For example, relevant information can be obtained by means of temperature control fuses only when, as a result of a load on, or possibly the destruction of, protective elements, a sufficiently large amount of power is transposed in the equipment to enable a threshold temperature of the temperature control fuses to be reached, if at all. This is not the case with many of the events occurring in instrumentation and control engineering, in particular with 4 mA to 20 mA-circuits or thermocouples.

When using opto-couplers in the diode path, it is not possible to ascertain whether the detected impulse has damaged or destroyed the diodes. There is no information available whatever as regards the condition of the gas discharge distance.

Finally, the ascertainment of a peak value of the total amount of current withdrawn does not provide any data on the state of the components of the diode path.

SUMMARY

The present invention provides a diagnostic method for two-stage excess voltage protection apparatuses and a two-stage excess voltage protection apparatus of the kind indicated above, by means of which a maintenance and an error display for two-stage excess voltage protection apparatuses is provided and wherein significantly more information concerning the components used in the excess voltage protection apparatus is made available than in the prior art.

Exemplary embodiments of the excess voltage protection apparatus according to the invention and advantageous variants of the diagnostic method of the invention are described below, in particular with reference to the dependent claims and the figures.

The diagnostic method of the kind mentioned above is developed, according to the invention, in that a secondary voltage connected to a secondary inductance that is actively connection, inductively, to a decoupling inductance is measured and evaluated with a view to excess voltage events.

The excess voltage protection apparatus of the kind described above is developed, according to the invention, in that a secondary inductance is present, which is actively connected, inductively, to a decoupling inductance, and an evaluation unit is present, which is connected to the secondary inductance and adapted to evaluate a secondary voltage connected to the secondary inductance.

It may be regarded as being a concept of the invention to supplement the decoupling inductance with the aid of a suitably positioned secondary inductance to form an inductive transducer. In this way, direct diagnostic access to electric currents and voltages is made possible within the excess voltage protection apparatus. An arrangement is regarded as being suitable, in which the secondary inductance is actively connected, inductively, to the decoupling inductance.

In particular, precise information can be obtained with the aid of the excess voltage protection apparatus of the invention and the method of the invention as to whether the excess voltage protection apparatus is in good condition, has been frequently used, or is defective.

Basically, Zener diodes can be used for the diode path. However, because of their steeper characteristics and higher discharge capacity, suppressor diodes are preferred, which are also referred to as TVS diodes. The diode path can, if desired, have a plurality of diodes, which can be connected in series and/or in parallel.

The gas discharge distance has at least one gas protection apparatus and can, if desired, comprise a plurality of gas protection apparatuses, which can be connected in series and/or in parallel.

Arrangements involving a plurality of diodes and/or a plurality of gas protection apparatuses can be referred to as a multi-stage diode path or a multi-stage gas discharge distance, respectively.

The decoupling inductance and secondary inductance can each have a plurality of individual coils.

The reference potential can basically be any potential. In an embodiment, the reference potential used is zero potential.

In the case of a first variant of the method of the invention, ignition events are counted and, following a number of a specifiable plurality of ignition events, a service request is issued. In the evaluation unit of the excess voltage protection apparatus of the invention, a double flank detector can be formed for this purpose, by means of which a check is carried out as to whether an ascending and a descending flank have arisen in a fixed period of time, which event is then regarded and counted as an ignition event. An excess voltage event during which a gas discharge has taken place is referred to as an ignition event.

Since the resistance is negligible across the diode path in conjunction with such ignition events, the secondary voltage connected to the secondary inductance is substantially equal to the voltage across the gas discharge distance. The double flank detector can therefore simply evaluate the course of the secondary voltage, with respect to time, when using the excess voltage protection apparatus of the invention.

The ignition events in the gas discharge distance differ quantitatively, because the higher the voltage increases across the gas discharge distance the steeper is the ascending flank. An important parameter of an ignition event can accordingly be determined by setting the maximum value for the secondary voltage.

Another important parameter in this respect is the maximum value of a derivative of the secondary voltage with respect to time, because this maximum value, which may also be referred to as the edge steepness, is equally characteristic of a certain ignition event. In addition, the maximum of the derivative, with respect to time, of the secondary voltage can be ascertained with the aid of the excess voltage protection apparatus of the invention. An important development of the method of the invention consists, therefore, in ascertaining a derivative, with respect to time, of the secondary voltage, in order then to ascertain a maximum value of this derivative, with respect to time, of the secondary voltage.

In addition, a useful parameter is the so-called dynamic response voltage. This is the quotient of the maximum value of the derivative, with respect to time, of the secondary voltage and the maximum value of the secondary voltage. Accordingly, in a further particularly preferred variant of the method of the invention, a quotient of the maximum value of the derivative, with respect to time, of the secondary voltage and the maximum value of the secondary voltage itself is formed, this quotient is compared with the dynamic response voltage as specified in the gas protection apparatus' specification, and a signal is generated, when the quotient does not conform to the specification. If this occurs, the excess voltage protection apparatus must be replaced.

The previously explained variants of the diagnostic method of the invention provide information on the gas discharge distance. Further, evaluations are also possible by means of which precise information on the diode path can be obtained.

For example, the diagnostic method of the invention can, in order to obtain a value that is proportional to the energy inputted into the diode path, especially during an excess voltage event or an ignition event, be advantageously improved in that, in a first stage, a time integral is formed over the secondary voltage, that in a second step, an amount of this time integral is formed, and that a time integral of this amount is formed in a third step. This evaluation can be simply accomplished in the evaluation unit provided by the invention. This development of the method is based on the following: Integration of the secondary voltage provides a voltage that is proportional to the current passing through the primary coil and is also proportional to the current passing through the diode path, because the current that passes through the connected device to be protected is negligible compared with the current passing through the diode path. The integral of this voltage is then formed and integration is repeated to yield a voltage that is proportional to the energy inputted into the diode path, especially during the course of an excess voltage event or ignition event.

With the aid of a further advantageous variant of the method of the invention, it is possible to ascertain the actual temperature of real interest of a suppressor diode forming the diode path in that a rise in temperature in the diode path is revealed by the fact that an energy release in the diode path to the environment is modeled, for example by a high pass, and that a temperature of the diode path is ascertained by adding the ambient temperature.

The temperature thus obtained can be compared with a destruction temperature of the diode, that is, for example, the suppressor diode, as per data sheet. Once the destruction temperature has been exceeded, it is practically assumed that the diode or the whole piece of equipment is defective, which is advantageously externally indicated.

The method described herein and, in particular, the concept of supplementing a decoupling activity with a secondary inductance to give an inductive transducer and of measuring and evaluating the reduced secondary voltage drop at the secondary inductance can also be extended to excess voltage protection apparatuses requiring protection for a plurality of conduction paths or distinguishable wire pairs. Then several transducers will be required and the existing branch currents and node voltages must be ascertained in a manner known per se while taking into account the Kirchhoff rules.

BRIEF DESCRIPTION OF THE DRAWINGS

Further advantages and features of the device according to the invention are described below with reference to the attached FIGS. 1 to 5.

Like or similarly effective components are usually marked by the same reference symbols in the figures.

DETAILED DESCRIPTION

Figure 1:
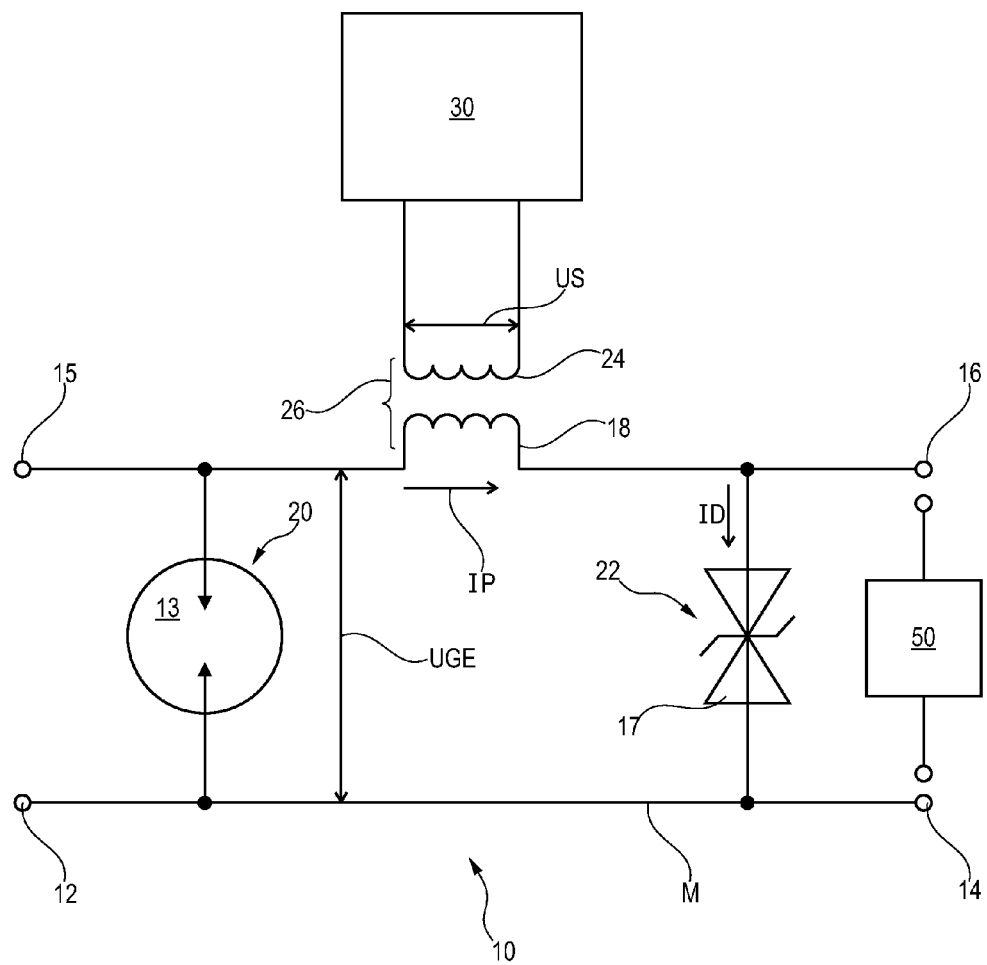
FIG. 1 is a diagram of an exemplary embodiment of the excess voltage protection apparatus of the invention.

FIG. 1 shows an exemplary embodiment of a two-stage excess voltage protection apparatus 10 according to the invention, which has a gas discharge distance 20 and a diode path 22. In the example shown, the gas discharge distance 20 is formed by a single gas arrester 13 and is connected between an input 15 and an input port 12 for a reference potential M. A voltage supplying the gas arrester 13 is marked with a double arrow UGE. In the shown example, the diode path 22 is formed by a single suppressor diode 17, which is interposed between an output 16 of the excess voltage protection apparatus 10 and an output port 14 for the reference potential M. Just as the gas discharge distance 20 can have a plurality of gas arresters 13, so can the diode path 22 comprise a plurality of diodes, more particularly suppressor diodes or TVS diodes. FIG. 1 shows the current passing through the diode path 22 with an arrow ID.

The input 15 and the output 16 are interconnected by a decoupling inductance 18. Current passing through this decoupling inductance is designated by an arrow IP.

In accordance with the present invention, as shown in FIG. 1, a secondary inductance 24 is positioned in direct proximity to the decoupling inductance 18 such that there is an inductive active connection between the decoupling inductance 18 and the secondary inductance 24, and due to the presence of these two components, an inductive transducer is formed, which is indicated in FIG. 1 by a curly bracket 26. The secondary inductance 24, also referred to as a secondary coil, can be formed by means of a center tap, which can be connected to a reference potential. Rectifying the secondary voltage is then simpler. A secondary voltage drop across the secondary inductance 24 is indicated in FIG. 1 by means of the double arrow US. This secondary voltage, i.e. that across the two terminals of the secondary inductance 24, is then passed to an evaluation unit 30 present according to the invention, in which the secondary voltage US is evaluated with a view to excess voltage events in the excess voltage protection apparatus.

In the case of excess voltage protection apparatuses of the type shown in FIG. 1, the excess voltage events can be divided into basically two groups. On the one hand, there are excess voltage events, during which the gas arrester 13 ignites. In the case of such events, which can also be referred to as ignition events, a majority of the current surge is absorbed by the gas arrester 13. And there are other excess voltage events, during which the gas arrester 13 does not ignite. During these events, the surge current dissipates completely through the decoupling inductance 18 and the diode path, for example only one suppressor diode or only one ZVS diode. This is described in more detail with reference to FIGS. 2 and 4.

Figure 2:
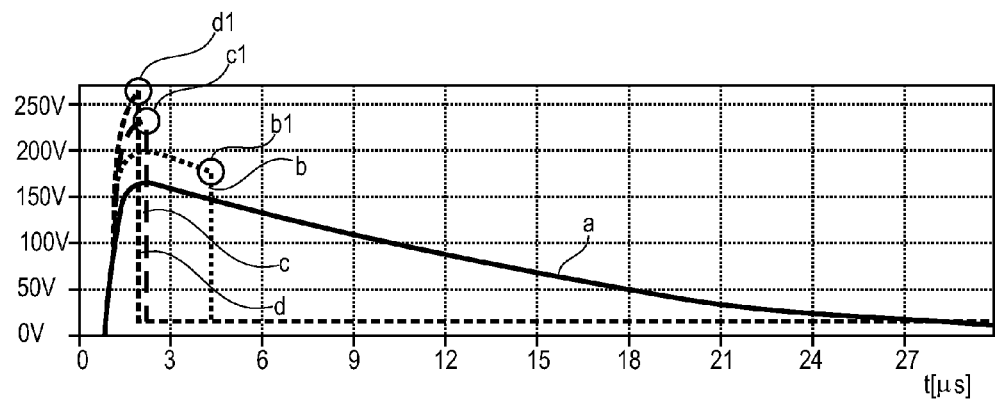
FIG. 2 shows typical time curves of the voltage across the gas discharge distance at various events of excess voltage.

FIG. 2 shows the voltage UGE connected to the gas arrester 13. As evident from FIG. 2, the curves b, c and d show sharp downward gradients at different points in time b1, c1 and d1. These are those points in time, at which the gas discharge begins, i.e. when the gas arrester 13 breaks through. In this context, it is of note that the voltage curves have different forms prior to the points in time b1, c1, and d1, and it is seen that the more the voltage across the gas discharge distance 20 increases, the faster it rises. In other words, for a steeply rising flank as, for example in curve d, a higher maximum value of the voltage UGE is reached than is the case with a less steeply rising, for example curve b. In this regard, the course of curve c lies between b and d. Further, it is to be observed that in curve "a" there is no sharply descending flank, which leads to the conclusion that there is no gas discharge in curve "a".

Figure 3:
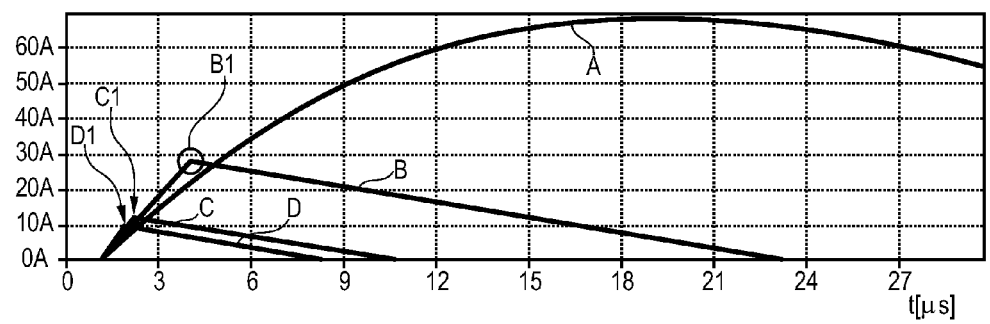
FIG. 3 shows the time curves of the current passing through the diode path corresponding to the time curves of the voltage across the gas discharge distance as shown in FIG. 2.

FIG. 3 shows the time curves A, B, C, and D, respectively, of the current passing across the diode path, pertaining to the voltage characteristics a, b, c, and d, respectively in FIG. 2. First, it is to be noted that in the case of the voltage curve "a" in FIG. 2, the time curve of the current passing through the diode path 50, shown by the curve "A" in FIG. 3, rises during, about 18 μs, until it reaches a maximum value of just under 70 ampere, after which it falls again. The time curve of the current demonstrated by curve "A" illustrates an excess voltage event during which the gas discharge distance 20 does not break through. The curve "A" shows no discontinuity and is fundamentally different in this from the other time curves of the current B, C, and D passing through the diode path 50, as shown in FIG. 3. In curves B, C, and D it is noticeable that the steeper the upward gradient, with which the current across the diode path 50 increases, the faster is the rise in voltage UGE present at the gas arrester 13. Then it must be noted that the points in time b1, c1, and d1, at which the voltage breaks down across the gas arrester 13 (see FIG. 2), correspond to the points in time B1, C1, and D1, respectively, at which the time curves B, C, and D, respectively, of current passing across the diode path 50 suddenly buckles to lower current values. Following this buckling, the curves B, C, and D descend with approximately the same negative gradient. Finally, it is evident from FIG. 3 that the greater the maximum current passing through the diode path 50, the more time it takes for the gas arrester 13 to break through.

Figure 4:
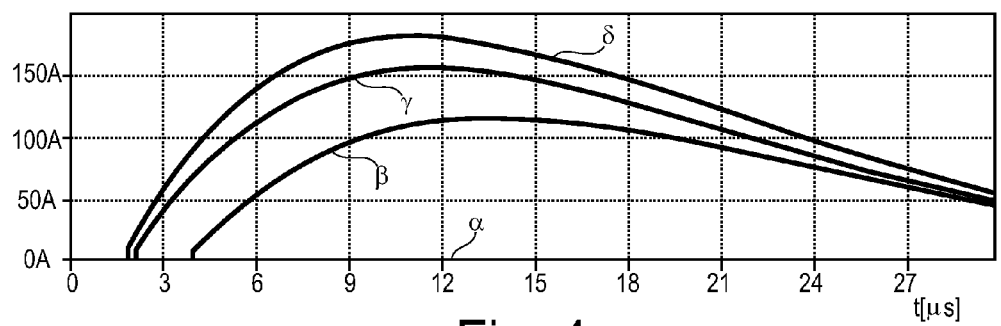
FIG. 4 shows the time curves of the current through the gas discharge distance for the time curves of the voltage across the gas discharge distance as shown in FIG. 2.

FIG. 4 shows the diagrams of corresponding current curves pertaining to the voltage curves "a" to d shown in FIG. 2. As there is no gas discharge for curve "a" in FIG. 2, no current passes through the gas discharge distance 20. The curve α in FIG. 4, which is pertains to curve "a" in FIG. 2, is coincident with the zero line. Then in FIG. 4, the current curves β, γ, and δ are shown, which correspond to the voltage curves b, c, and d, respectively, in FIG. 2. It should be noted that each of the current curves rises to a maximum value in a smooth curve and then drops again as the curve proceeds, but at a slower rate than its increase. Insofar consistent with the voltage curves shown in FIG. 2, it is seen also that the greater the maximum value of the current attained in each case in the curves β, γ, and δ the greater is the maximum value of the voltage across the gas discharge distance 20. Finally, the current rise in each case begins at the points in time visible in FIG. 2.

The excess voltage events which produce the curves b/B/β, c/C/γ, and d/D/δ are thus excess voltage events during which the gas arrester 13 ignites. Accordingly, they relate to ignition events.

Only that event that produced the curves a/A/α belongs to the second group of excess voltage events, namely those during which the gas arrester 13 does not ignite. With these events the surge current dissipates completely via the decoupling coil 18 and the diode path 22, in the situation as shown in FIG. 1, i.e. via the suppressor diode 17. Nevertheless, the protection apparatus according to the invention works reliably also during the event of a/A/α, during which the surge current is discharged via the decoupling inductance or decoupling coil 18 and through the diode path 50.

The question as to whether the gas arrester 13 ignites or not depends, as explained, on the amplitude, i.e. a maximum value of the voltage, and the edge steepness of the excess voltage impulse, that is, a maximum of a derivative, with respect to time, of the secondary voltage.

Figure 5:
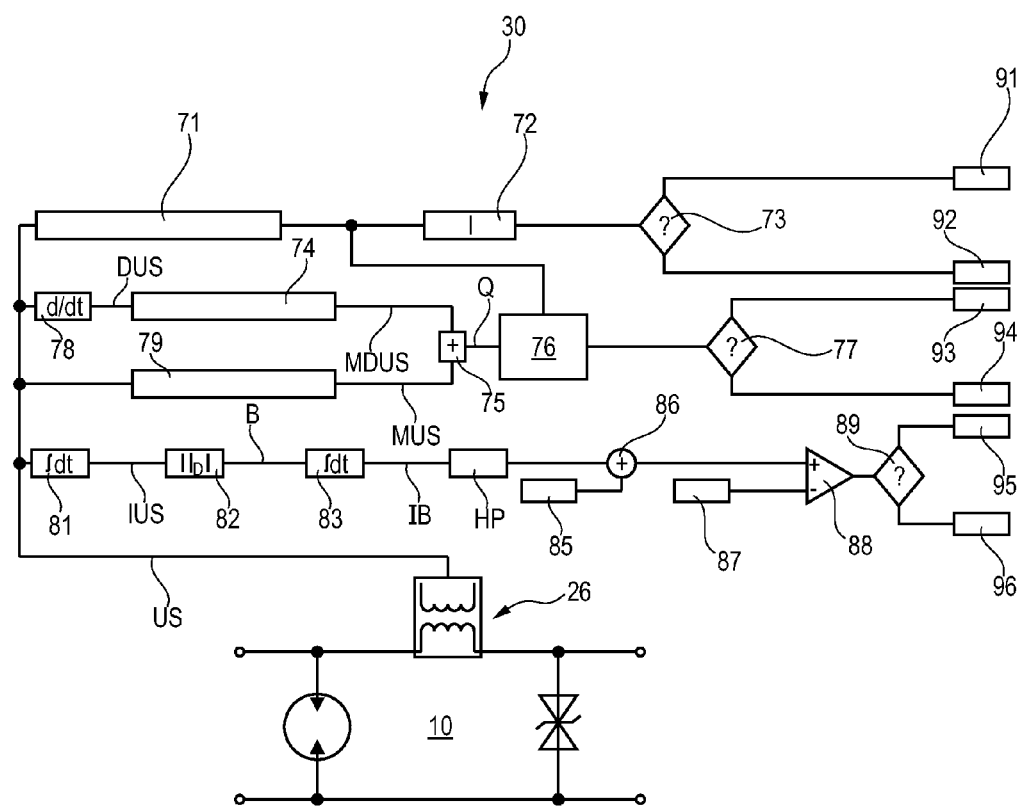
FIG. 5 is a diagram illustrating the evaluation possibilities of the secondary voltage using an evaluation unit in accordance with embodiments.

In the context of FIG. 5, three different evaluation approaches will now be described, which can be carried out in each case with the aid of the evaluation unit 30 provided by the invention. The evaluation unit 30 according to the invention can be, for example, a microcontroller or a comparable intelligent component. It should be generally noted, particularly in the following description, that values of physical parameters, such as voltage, current, temperature, etc., are represented in the evaluation circuit by voltages, which are proportional to the respective physical parameters.

Firstly, an excess voltage protection apparatus 10 of the invention is diagrammatically shown in FIG. 5 comprising the transducer 26 shown therein. Likewise, a conductor is diagrammatically shown, by means of which the secondary voltage US is conducted by the excess voltage protection apparatus 10 to the above-mentioned three evaluation branches. The first evaluation branch generates evaluation signals to the outputs 91 and 92. The second evaluation branch generates signals to the outputs 93 and 94. The third evaluation branch sends evaluation signals to the outputs 95 and 96.

The term "output" expresses in this context merely that it is an output of the evaluation branches described herein. However, this does not necessarily imply that these outputs will be connected to an external entity, for example an interface. This is indeed possible, but it is equally possible for the signals delivered at the outputs 91 to 96 to be passed to a further internal processing.

The first evaluation branch is adapted to detect excess voltage events, during which the gas arrester 13 has ignited. This takes place with the aid of a double flank detector 71, which monitors whether, in a specific time frame, two voltage flanks of the secondary voltage US, one with a positive gradient and the other with a negative gradient, can be ascertained in the secondary inductance 24. Such double flanks occur, as is evident from FIG. 2 for curves b, c, and d, when the gas arrester 13 ignites due to a sufficiently large maximum voltage of the excess voltage impulse. The number of ignition events thus detected are counted with the aid of a counter 72 and compared with a specifiable limit value in the query stage 73. If the number of ignition events is higher than the specified limit value, then a service request can be signaled or displayed. For example, a signal "gas arrester worn out" can be given at the output 91 and a signal "gas arrester unspent" at the output 92.

In the second evaluation branch, the maximum value MUS of the secondary voltage US of the transducer 26, also referred to as the peak value of the secondary voltage US, is detected. This is done with the aid of a first peak value detector 79, which displays the maximum secondary voltage MUS at its output. In addition, a derivative, with respect to time, DUS of the secondary voltage US is formed in the unit 78, which is made available at an output of the unit 78. Using a second peak value detector 74, a peak or maximum value MDUS of this derivative, with respect to time, DUS is formed and then presented at an output of the second peak value detector 74. This peak value MDUS, which, it will be remembered, is a voltage, is proportional to the maximum edge steepness of the first ascending flank. From these two parameters, that is to say, the maximum secondary voltage MUS and the maximum derivative, with respect to time, of the secondary voltage MDUS, a quotient Q is determined in the unit 75. This is the so-called dynamic response voltage. The voltage MUS is the response voltage of the gas arrester 13 when it has ignited. The maximum value of the derivative, with respect to time, of the secondary voltage MDUS corresponds to the maximum edge steepness of the excess voltage impulse. The dynamic response voltage is thus the response voltage in relation to the maximum edge steepness.

The quotient Q, i.e., the dynamic response voltage, is then passed to the unit 76, which relays the value Q only when an ignition event has taken place, that is to say, when the gas arrester 13 has ignited. This information is made available to unit 76 via the output of the double flank detector 71. If an ignition event has taken place, the quotient Q is then compared with the specification data, and in stage 77 a decision is made as to whether the dynamic response voltage Q of the gas arrester 13 conforms to the specification. For example, a signal "gas arrester defective" is displayed at the output 93 and a signal "gas arrester intact" at the output 94.

Using the third evaluation branch, information concerning the diode link can be obtained, especially concerning the particularly important temperature of the depletion layer of the suppressor diode 17. First of all, the integral IUS, with respect to time, of the secondary voltage US of the transducer 26 is formed in the unit 81. This integral IUS, with respect to time, is proportional to the current IP passing through the decoupling inductance 18 and thus proportional to the current passing through the suppressor diode 17, see FIG. 1. The integral IUS, with respect to time, is then passed to the unit 82, which forms the absolute value B of the integral IUS. As can be seen from FIG. 5, this amount is then fed to stage 83, which ascertains the integral IB, with respect to time, therefrom. This integral IB, with respect to time, is proportional to the energy input into the suppressor diode 17 during a transient excess voltage event.

The value of IB is then fed to a high pass HP, by means of which the derivative, with respect to time, of the thermal energy dissipation of the suppressor diode 17, that is to say, the decrease in temperature of the suppressor diode 17 is modeled or simulated. In this case, the relevant mechanisms are thermal loss due to radiation and thermal loss due to convection. Thus, a voltage can be obtained at the high pass HP output, which voltage is proportional to the increase in temperature of the depletion layer of the suppressor diode 17 in relation to the environment.

By way of a connection 85, the ambient temperature is then supplied and added to the temperature increase of the depletion layer in stage 86. There is thus obtained at the output of stage 86 a temperature value of the depletion layer of the suppressor diode 17. This is then compared, in the comparator unit 88, with a destruction temperature known from a data sheet which destruction temperature is fed to the comparator 88 via the connection 87. The comparator 88 then provides information at its output as to whether the destruction temperature of the suppressor diode 17 has been exceeded or not. If it is found that the destruction temperature has been exceeded once, it is expedient to assume that the suppressor diode 17 or even the entire excess voltage protection apparatus 10 is destroyed. Thus, for example, a signal "suppressor diode defective" can be given at the output 95 and a signal "suppressor diode intact" at the output 96.

The present invention provides a novel two-stage excess voltage protection apparatus, which, unlike the prior art, provides clear statements on the condition of the excess voltage protection apparatus independently of the characteristics of any electric circuit to be protected. Using the method of the invention and the excess voltage protection apparatus of the invention, it is possible to monitor real component parameters. The method is independent of the parameters of the electrical equipment to be protected. It can be seen whether the ignition voltage of the gas arrester is still true to specification. Finally, it can be discerned whether the suppressor diode or other used diodes have been operated outside of their specification and, consequently, destruction thereof is to be assumed.

The invention claimed is:
1. A diagnostic method for a multiple-stage excess voltage protection apparatus, the excess voltage protection apparatus including:

at least one gas discharge distance between an input and a reference potential as a first stage, at least one diode path between an output and the reference potential as a further stage, and at least one decoupling inductance interposed between the input and the output, the method comprising:

measuring and evaluating a secondary voltage which is present at a secondary inductance, which is actively connected, inductively, to the decoupling inductance, and measuring and evaluating the secondary voltage with a view to excess voltage events in the excess voltage protection apparatus, wherein a derivative, with respect to time, of the secondary voltage is determined, and wherein a quotient of a maximum value of the derivative, with respect to time, and a maximum value of the secondary voltage is formed, the quotient is compared with values of a specification, and a signal is produced, when the quotient does not conform to specification.

2. The diagnostic method as defined in claim 1, wherein a check is made as to whether an ascending and a descending flank of the secondary voltage occur in a fixed period of time, such an event being evaluated as an ignition event.

3. The diagnostic method as defined in claim 2, wherein the number of ignition events is ascertained.

4. The diagnostic method as defined in claim 1, wherein a parameter proportional to an energy input into the diode path, during an excess voltage event, is ascertained in that in a first stage, a first integral, with respect to time, is formed over the secondary voltage, in a second stage, an amount of the first integral, with respect to time, is formed, and in a third stage, an integral, with respect to time, of the amount is formed, in order to obtain a quantity proportional to the energy inputted into the diode path, in a course of the excess voltage event.

5. The diagnostic method as defined in claim 1, wherein an increase in a temperature in the diode path is ascertained in that an energy release of the diode path to an environment is modeled and, by the addition of an ambient temperature, the temperature of the diode path is ascertained.

6. An excess voltage protection apparatus, comprising:

an input and an output, wherein an electrical device is capable of being connected between the output and a reference potential and is to be protected from excess voltage events that occur between the input and the reference potential, at least one gas discharge distance between the input and the reference potential, at least one diode path between the output and the reference potential, at least one decoupling inductance interposed between the input and the output, a secondary inductance, which is actively connected, inductively, to the decoupling inductance, and an evaluation unit, which is connected to the secondary inductance and is adapted to evaluate a secondary voltage which is present at the secondary inductance, wherein the evaluation unit: determines a derivative, with respect to time, of the secondary voltage, determines a quotient of a maximum value of the derivative, with respect to time, and a maximum value of the secondary voltage, compares the quotient with values of a specification, and produces a signal, when the quotient does not conform to specification.

7. A diagnostic method for a multiple-stage excess voltage protection apparatus, the excess voltage protection apparatus including:

at least one gas discharge distance between an input and a reference potential as a first stage, at least one diode path between an output and the reference potential as a further stage, and at least one decoupling inductance interposed between the input and the output, the method comprising:

measuring and evaluating a secondary voltage which is present at a secondary inductance, which is actively connected, inductively, to the decoupling inductance, and measuring and evaluating the secondary voltage with a view to excess voltage events in the excess voltage protection apparatus, wherein a parameter proportional to an energy input into the diode path, during an excess voltage event, is ascertained in that in a first stage, a first integral, with respect to time, is formed over the secondary voltage, in a second stage, an amount of the first integral, with respect to time, is formed, and in a third stage, an integral, with respect to time, of the amount is formed, in order to obtain a quantity proportional to the energy inputted into the diode path, in a course of the excess voltage event.

8. The diagnostic method as defined in claim 7, wherein a check is made as to whether an ascending and a descending flank of the secondary voltage occur in a fixed period of time, such an event being evaluated as an ignition event.

9. The diagnostic method as defined in claim 8, wherein the number of ignition events is ascertained.

10. The diagnostic method as defined in claim 7, wherein a maximum value of the secondary voltage is determined.

11. The diagnostic method as defined in claim 7, wherein a derivative, with respect to time, of the secondary voltage is determined.

12. The diagnostic method as defined in claim 11, wherein a maximum value of the derivative, with respect to time, of the secondary voltage is determined.

13. The diagnostic method as defined in claim 7, wherein an increase in a temperature in the diode path is ascertained in that an energy release of the diode path to an environment is modeled and, by the addition of an ambient temperature, the temperature of the diode path is ascertained.

14. An excess voltage protection apparatus, comprising:

an input and an output, wherein an electrical device is capable of being connected between the output and a reference potential and is to be protected from excess voltage events that occur between the input and the reference potential, at least one gas discharge distance between the input and the reference potential, at least one diode path between the output and the reference potential, at least one decoupling inductance interposed between the input and the output, a secondary inductance, which is actively connected, inductively, to the decoupling inductance, and an evaluation unit, which is connected to the secondary inductance and is adapted to evaluate a secondary voltage which is present at the secondary inductance, wherein the evaluation unit determines a parameter proportional to an energy input into the diode path, during an excess voltage event forms a first integral, in a first stage, with respect to time, over the secondary voltage, determines, in a second stage, an amount of the first integral, with respect to time, and forms an integral, in a third stage, with respect to time, of the amount, in order to obtain a quantity proportional to the energy inputted into the diode path, in a course of the excess voltage event.

* * * * *